United States Patent
Zwiebel et al.

(10) Patent No.: US 9,312,838 B2
(45) Date of Patent: Apr. 12, 2016

(54) APPARATUS AND METHOD FOR TRANSFERRING MULTIPLE ASYNCHRONOUS CLOCK SIGNALS OVER A SINGLE CONDUCTOR

(71) Applicant: Alcatel-Lucent USA, Inc., Murrray Hill, NJ (US)

(72) Inventors: Jeffrey L. Zwiebel, Plano, TX (US); Andrea Galbiati, Vimercate (IT)

(73) Assignee: Alcatel Lucent, Boulogne-Billancourt (FR)

( * ) Notice: Subject to any disclaimer, the term of this patent is extended or adjusted under 35 U.S.C. 154(b) by 199 days.

(21) Appl. No.: 14/107,878

(22) Filed: Dec. 16, 2013

(65) Prior Publication Data
US 2015/0171850 A1    Jun. 18, 2015

(51) Int. Cl.
*H03K 3/00* (2006.01)
*H03K 5/1534* (2006.01)
*H03K 5/00* (2006.01)

(52) U.S. Cl.
CPC .... *H03K 5/1534* (2013.01); *H03K 2005/00293* (2013.01)

(58) Field of Classification Search
CPC ..................................... H03K 5/1534
See application file for complete search history.

(56) References Cited

U.S. PATENT DOCUMENTS

| | | | |
|---|---|---|---|
| 5,056,119 A | 10/1991 | Sakalian et al. | |
| 5,602,880 A | 2/1997 | Webster et al. | |
| 5,834,979 A * | 11/1998 | Yatsuka | 331/1 R |
| 8,344,769 B2 * | 1/2013 | Adachi | 327/156 |
| 8,390,347 B1 * | 3/2013 | Sinha et al. | 327/156 |
| 2002/0181360 A1 * | 12/2002 | Hamada et al. | 369/47.28 |
| 2007/0025489 A1 * | 2/2007 | Milton et al. | 375/375 |
| 2008/0266001 A1 * | 10/2008 | Griffin | 331/25 |
| 2008/0315921 A1 * | 12/2008 | Cha et al. | 327/42 |
| 2011/0055671 A1 * | 3/2011 | Kim et al. | 714/800 |
| 2011/0063039 A1 * | 3/2011 | Maruko | 331/1 R |
| 2011/0156766 A1 * | 6/2011 | Ahn et al. | 327/142 |
| 2011/0156767 A1 * | 6/2011 | Ahn et al. | 327/142 |
| 2011/0291730 A1 * | 12/2011 | Ahn et al. | 327/276 |
| 2014/0097877 A1 * | 4/2014 | Baeckler et al. | 327/149 |

* cited by examiner

*Primary Examiner* — Ryan Jager
(74) *Attorney, Agent, or Firm* — Hitt Gaines, P.C.

(57) ABSTRACT

Methods and systems for transferring two clock signals over a single conductor are disclosed. According to various disclosed embodiments, first and second input clock signals are generated at a first module. The rising and falling edges of a generated reference clock signal are used to transfer the two clock signals from the first module to a second module over the single conductor.

18 Claims, 6 Drawing Sheets

APPARATUS AND METHOD FOR TRANSFERRING MULTIPLE ASYNCHRONOUS CLOCK SIGNALS OVER A SINGLE CONDUCTOR

TECHNICAL FIELD

This application is directed, in general, to microelectronics and telecommunication systems.

BACKGROUND

In microelectronics and telecommunication systems, two or more separate asynchronous clock signals are often required. For example, in a telecommunication system, a module may generate a first clock signal that is synchronized to an external network clock and a second clock signal that is not synchronized (i.e. free-run) to the external network clock. If multiple modules require a free-run clock signal, it may be necessary to add a crystal oscillator clock to each module. Since crystal oscillator clocks are generally expensive, adding a crystal oscillator to each module may increase the total cost of a system. Other examples include a need for modules to use common clocks or for RAN sharing scenarios in which a single module typically receives two or more clock signals generated by two or more external networks sharing the same installation.

To avoid requiring each module to have its own crystal oscillator clock, a dedicated conductor (which may take the form of a wire, line, trace or via) may be used to transfer each clock signal from a core module to one or more peripheral modules. For example, a master CPU module may provide a synchronized clock signal and a free-run clock signal. A first conductor may be used to transfer the synchronized clock signal from the master CPU module to the peripheral modules and a second conductor may be used transfer the free-run clock signal from the master CPU module to the peripheral modules. However, two dedicated conductors may not always be available to transfer two clock signals. If only one conductor is available, both clock signals may not be available at all times in the peripheral modules. In such cases, one of the two clock signals may be selected at each module based on configuration parameters, and the selected clock signal may be transferred to the peripheral module.

SUMMARY

Various disclosed embodiments are directed to methods and systems for transferring two clock signals over a single conductor. The method includes generating, at a first module, first and second input clock signals. The method includes detecting, at the first module, a rising edge of the first input clock signal, and in response generating a first enable signal. The method includes detecting, at the first module, a rising edge of the second input clock signal, and in response generating a second enable signal. The method includes inserting a guard time between the first and the second enable signals to prevent overlap of the first and second enable signals.

The method includes generating, at the first module, a reference clock signal responsive to the first and second enable signals. The reference clock signal is representative of the first and second enable signals.

Certain embodiments include receiving by a second module over the single conductor the reference clock signal. The method includes detecting, at the second module, rising and falling edges of the reference clock signal, and in response generating respective third and fourth enable signals. The method includes generating, at the second module, a first output clock signal by tracking the third enable signal. The method includes generating, at the second module, a second output clock signal by tracking and integrating the fourth enable signal. The first and second output clock signals are representative of the respective first and second input clock signals.

According to various disclosed embodiments, the first input clock signal is synchronized with a network clock, and the second input clock signal is a free-run clock signal or a second network clock if required by a specific application (e.g., RAN sharing). The first module may be a central processor unit (CPU) module, and the second module may be a peripheral module.

According to various disclosed embodiments, the method includes generating an unadjusted first enable signal responsive to the first input clock signal, and dividing the unadjusted first enable signal by a first predetermined factor to generate the first enable signal. The method includes receiving, by a dual clock generator, the first and second enable signals, and generating, by the dual clock generator, the reference clock signal responsive to the first and second enable signals.

According to various disclosed embodiments, a system for transfer of two clock signals over a single conductor includes first and second modules connected by a single conductor. The first module includes first and second clocks operable to generate first and second input clock signals, respectively. The first and second input clock signals are asynchronous in relation to one another.

The first module includes a first edge detector configured to receive the first input clock signal. The first edge detector operable to detect a rising edge of the first input clock signal and to generate a first enable signal. The first module includes a second edge detector configured to receive the second input clock signal. The second edge detector is operable to detect the rising edge of the second input clock signal and to generate a second enable signal.

The first module may include a first divider configured to receive the first enable signal and operable to generate a first adjusted enable signal based on a first predetermined factor. The first module may include a dual clock generator configured to receive the first adjusted enable signal and the second enable signal, and in response operable to generate a reference clock signal.

According to various disclosed embodiments, the second module includes a third edge detector configured to receive the reference clock signal via the single conductor. The third edge detector is operable to detect the rising edge of the reference clock signal and to generate a third enable signal. The second module includes a fourth edge detector configured to receive the reference clock signal via the single conductor. The fourth edge detector is operable to detect the falling edge of the reference clock signal and to generate a fourth enable signal. The second module includes a first oscillator configured to receive the third enable signal and operable to phase-track the third enable signal to generate a first output clock signal. The second module includes a numerically controlled oscillator configured to receive the fourth enable signal and operable to adjust the fourth enable signal to generate a fifth enable signal. The second module includes a second oscillator configured to receive the fifth enable signal and operable to generate a second output clock signal based on a second predetermined factor.

According to various disclosed embodiments, a system is configured to transmit two asynchronous clock signals over a single conductor. The system comprises a first module including first and second clocks operable to generate first and second input clock signals, respectively, wherein the first and second input clock signals are asynchronous in relation to one another. The first module includes a first edge detector configured to receive the first input clock signal and operable to detect a rising edge of the first input clock signal and to generate a first enable signal. The first module includes a second edge detector configured to receive the second input clock signal and operable to detect the rising edge of the second input clock signal and to generate a second enable signal. The first module includes a first divider configured to receive the first enable signal and operable to generate a first adjusted enable signal based on a first predetermined factor. The first module includes a dual clock generator configured to receive the first adjusted enable signal and the second enable signal, and in response operable to generate a reference clock signal, wherein the reference clock signal is transmitted over the single conductor.

According to various disclosed embodiments, the system comprises a second module including a first edge detector configured to receive the reference clock signal over the single conductor and operable to detect a rising edge of the reference clock signal and to generate a first enable signal. The second module includes a second edge detector configured to receive the reference clock signal via the single conductor and operable to detect a falling edge of the reference clock signal and to generate a fourth enable signal. The second module includes a first controlled oscillator configured to receive the first enable signal and operable to track the first enable signal to generate a first output clock signal. The second module includes an integer controlled oscillator configured to receive the second enable signal and operable to generate a third enable signal that compensates the rate of the second enable signal. The second module includes a second controlled oscillator configured to receive the third enable signal and operable to track the third enable signal to generate a second output clock signal.

BRIEF DESCRIPTION

Reference is now made to the following descriptions taken in conjunction with the accompanying drawings, in which.

DETAILED DESCRIPTION

FIGS. 1-6, discussed below, and the various embodiments used to describe the principles of the present disclosure are by way of illustration only and should not be construed in any way to limit the scope of the disclosure. Those skilled in the art will recognize that the principles of the disclosure may be implemented in any suitably arranged device or a system. The numerous innovative teachings of the present disclosure will be described with reference to exemplary non-limiting embodiments.

Various disclosed embodiments include systems and methods for transferring two clock signals from a first module to a second module over a single conductor. The disclosed embodiments may be implemented in a telecommunication system, for example, where a first module may provide a first clock signal that is synchronized to an external network clock and may also provide a second clock signal that is not synchronized to the external network clock (i.e. free-run clock signal or a network clock from a different external network). The first module may, for example, be a central processor unit (CPU) module and the second module may be a peripheral module.

According to disclosed embodiments, rising and falling edges of a reference signal are used to transfer the first and second clock signals between two modules over a single conductor. By allowing transfer of two clock signals over a single conductor, the disclosed embodiments eliminate the need to provide separate crystal oscillators in each module or to provide dedicated conductors for the transmission of two clock signals.

Figure 1:
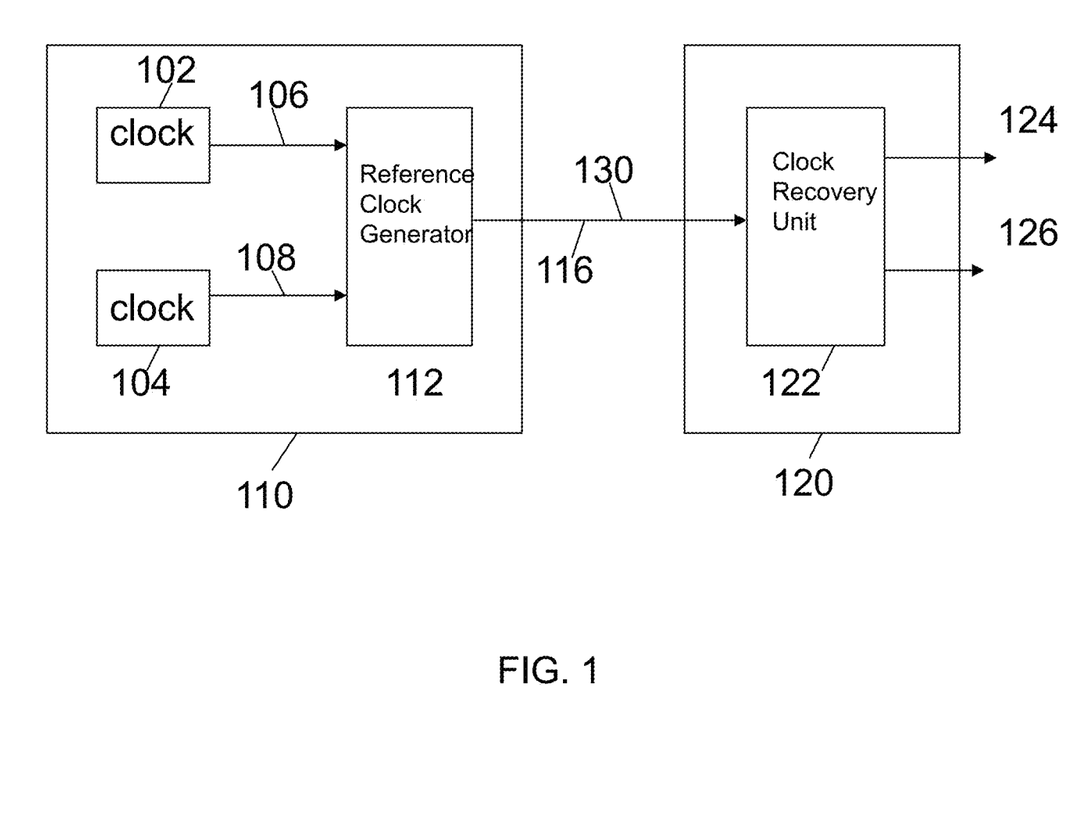
FIG. 1 illustrates a block diagram of a system in which disclosed embodiments can be implemented.

FIG. 1 depicts a block diagram of system 100 in which the disclosed embodiments can be implemented, for example, as a system particularly configured for transferring two clock signals over a single conductor. The disclosed embodiments may be implemented in a telecommunication system where module 110 transmits two asynchronous clock signals to module 120 over conductor 130. Module 110 may be a CPU module and module 120 may be a peripheral module. Although, FIG. 1 illustrates transfer of two clock signals between only two modules, the disclosed embodiments can be implemented for transferring two clock signals among three or more modules.

Referring again to FIG. 1, module 110 includes clocks 102 and 104 which generate clock signals 106 and 108, respectively. Clock signal 106 may be synchronized to an external network clock while clock signal 108 may not be synchronized to the external network clock (i.e. free-run clock signal or synchronized to a different external network). Thus, clock signals 106 and 108 are asynchronous with respect to one another.

According to various disclosed embodiments, system 100 includes dual reference clock generator 112 configured to receive clock signals 106 and 108. Dual reference clock generator 112 detects a rising edge of clock signal 106 and a rising edge of clock signal 108, and in response generates reference clock signal 116 which is transmitted over conductor 130. Dual reference clock generator 112 may be implemented within a field programmable gate array (FPGA). In other embodiments, the falling edges of the clock signals 106 and 108 may be used instead of the rising edges to generate reference clock signal.

According to various disclosed embodiments, module 120 receives reference clock signal 116 via conductor 130. Module 120 includes clock recovery unit 122 configured to detect rising and falling edges of reference clock signal 116, and in response generates first and second output clock signals, 124, 126, respectively. First and second output clock signals, 124, 126, are representative of respective first and second input clock signals, 106, 108. Clock recovery unit 122 may be implemented within an FPGA.

Figure 2:
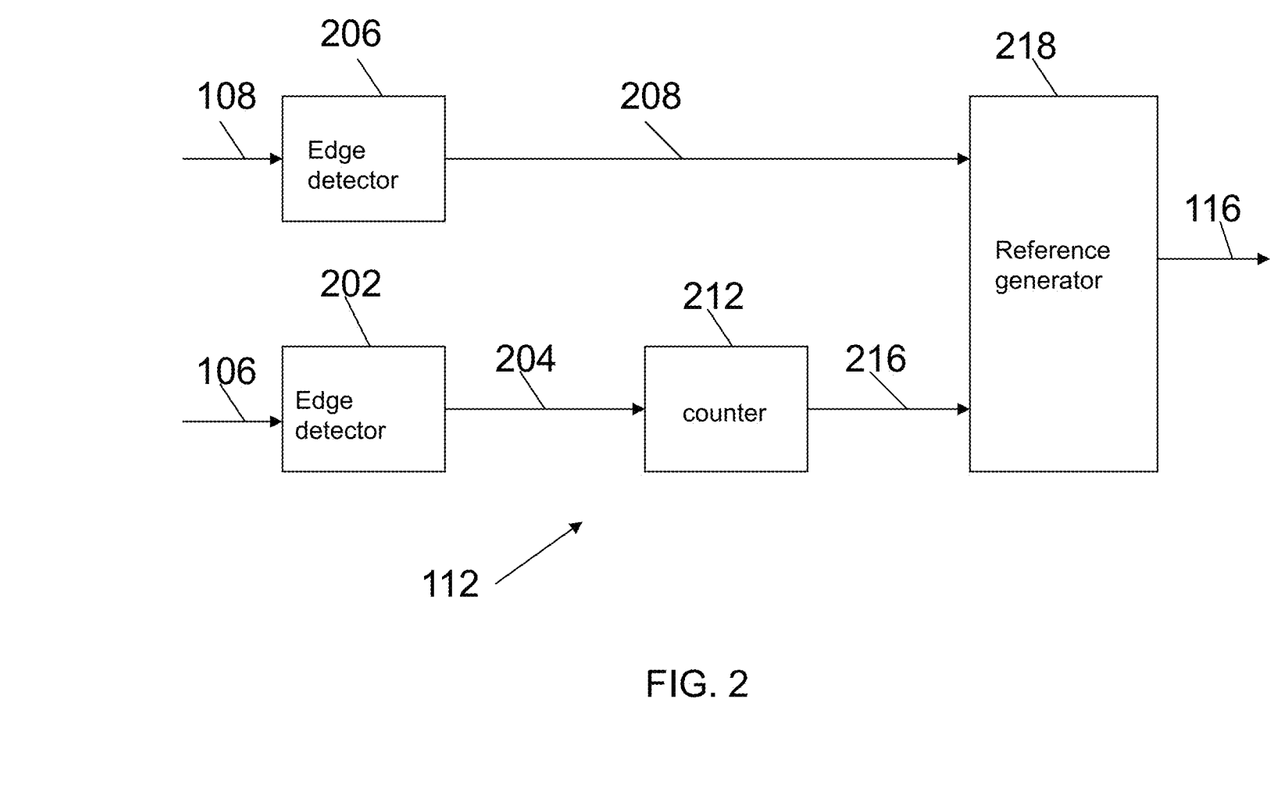
FIG. 2 illustrates a block diagram of a dual reference clock generator according to various disclosed embodiments.

FIG. 2 illustrates a block diagram of dual reference clock generator 112 according to various disclosed embodiments. Clock generator 112 includes edge detector 202 configured to detect a rising edge of clock signal 106, and in response edge detector 202 generates first enable signal 204.

Clock generator 112 also includes edge detector 206 configured to detect a rising edge of clock signal 108, and in response edge detector generates second enable signal 208.

Clock generator 112 also includes counter 212 (or divider) configured to receive first enable signal 204. Counter 212 delays first enable signal 204 by a predetermined time period and generates first adjusted enable signal 216.

Since first and second clock signals 106, 108, are asynchronous with respect to one another, the two clock signals will overlap periodically. In order to prevent overlapping of the two clock signals, a guard time (i.e., delay) is inserted by clock generator 112 between the two signals to ensure the reference signal is stable for an adequate time before and after each rising edge.

Referring now to FIG. 2, the insertion of a guard time (i.e., delay) is described. By way of example, counter 212 delays first enable signal 204 to insert a guard time (e.g., 20 ns). In addition, enables from edge detector 206 may be suppressed for a predetermined time period after the arrival of the rising edge of the first clock signal 106. It will be appreciated that the guard time (e.g., 20 ns) is selected based on the respective frequencies of the first and second clock signals, and other guard times may be chosen depending on the frequencies of the clock signals.

Consider, for example, that the frequency of first clock signal is 25 MHz, and the frequency of the second clock signal is 12.8 MHz. Thus, the frequency of first enable signal, which is generated responsive to the rising edge of the first clock signal, is approximately 25 MHz. According to disclosed embodiments, counter 212 (or divider) converts the frequency of first enable signal 204 to 12.5 MHz. Consequently, first adjusted enable signal 216 and second enable signal 208 have respective frequencies that are approximately close to one another.

According to disclosed embodiments, first adjusted enable signal 216 and second enable signal 208 are received by reference generator 218. Reference generator 218 generates reference clock signal 116 responsive to first adjusted enable signal 216 (forcing rising edges on reference clock) and second enable signal 208 (forcing falling edges on reference clock). Reference clock signal 116 is transmitted to module 120 over conductor 130.

Figure 3:
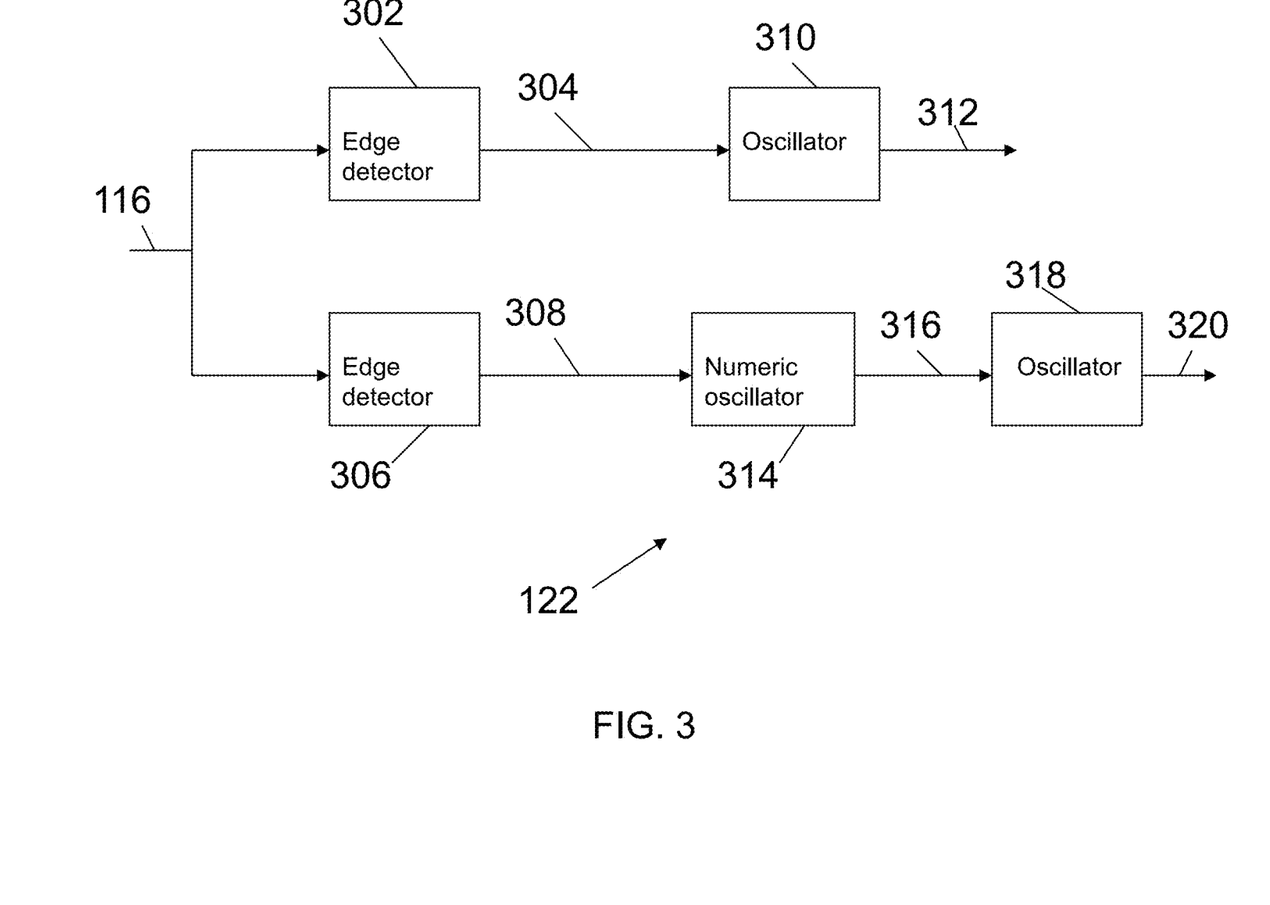
FIG. 3 illustrates a block diagram of a clock recovery unit according to various disclosed embodiments.

FIG. 3 illustrates a block diagram of clock recovery unit 122 of module 120 according to various disclosed embodiments. Clock recovery unit 122 includes third edge detector 302 configured to receive reference clock signal 116 via conductor 130. Third edge detector detects the rising edge of reference clock signal 116, and in response generates third enable signal 304. Clock recovery unit 122 includes fourth edge detector 306 configured to receive reference clock signal 116. Fourth edge detector 306 detects the falling edge of reference clock signal 116, and in response generates fourth enable signal 308.

Clock recovery unit 122 may include first oscillator 310 configured to receive third enable signal 304. First oscillator 310 tracks the third enable signal and generates first output clock signal 312.

Clock recovery unit 122 may include numerically controlled oscillator 314 configured to receive fourth enable signal 308. Numerically controlled oscillator 314 adapts (i.e., compensates) fourth enable signal 308 and generates fifth enable signal 316. The adaptation is needed to compensate for the enable signal that was removed or added during the guard time that was enforced by clock generator 112 of module 110.

Clock recovery unit 122 may also include oscillator 318 configured to receive fifth enable signal 316. Oscillator 318 tracks fifth enable signal 316 and generates second output clock signal 320.

Figure 4:
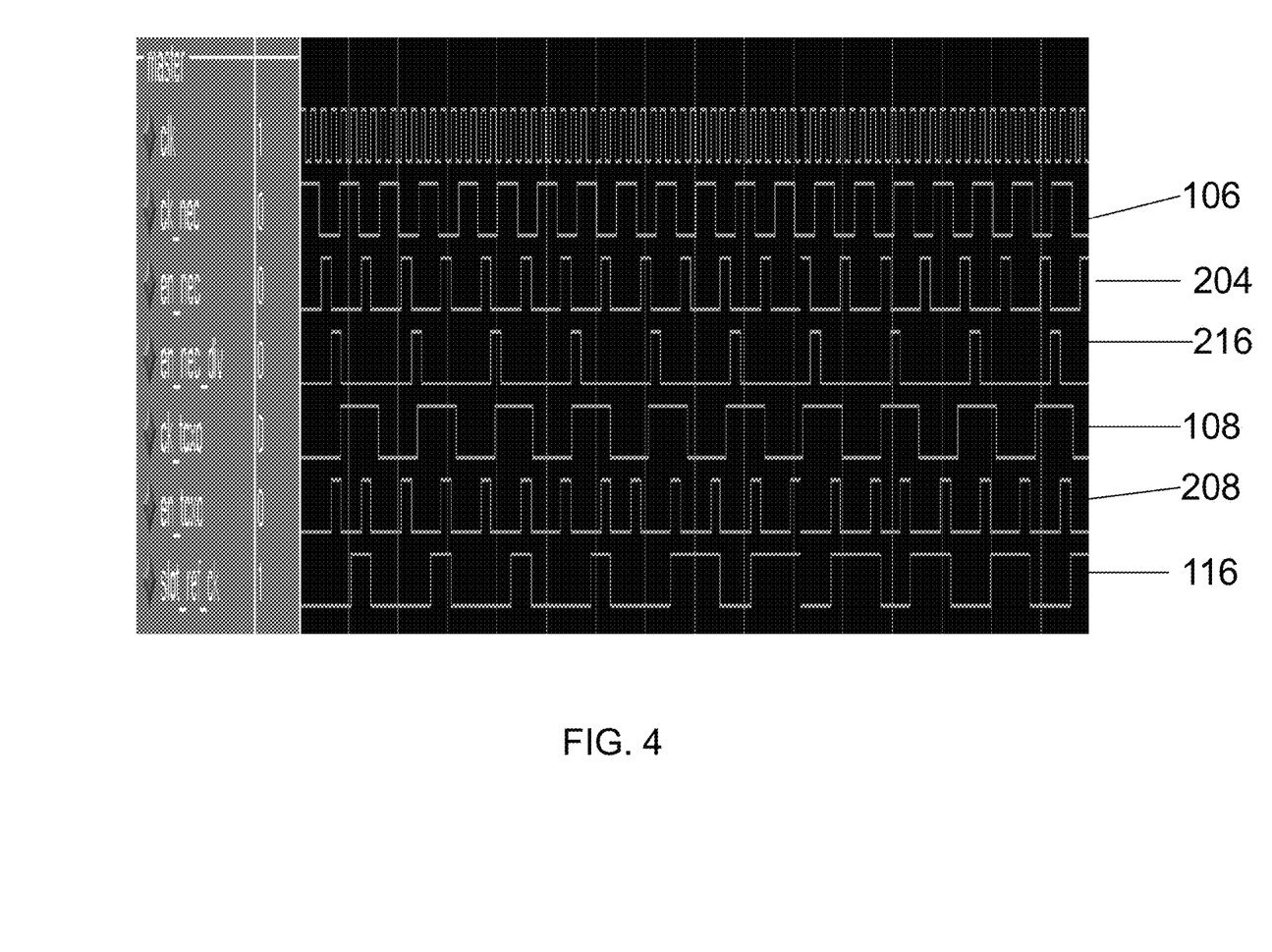
FIG. 4 illustrates exemplary waveforms in a reference clock generator.

FIG. 4 illustrates the following waveforms in reference clock generator 112: clock signal 106; first enable signal 204; clock signal 108; second enable signal 208; first adjusted signal 216; and reference clock signal 116.

Figure 5:
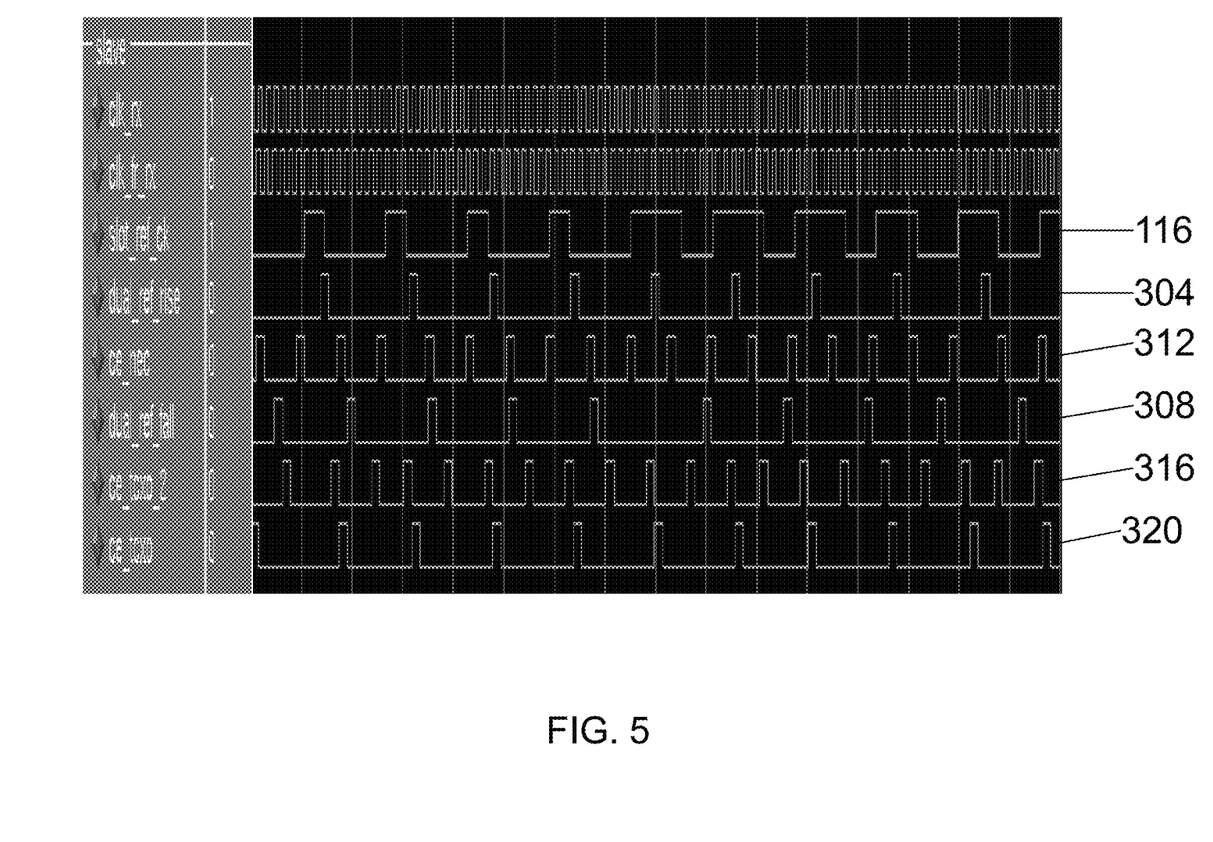
FIG. 5 illustrates exemplary waveforms in a clock recovery unit.

FIG. 5 illustrates the following waveforms in clock recovery unit 122: reference clock signal 116; third enable signal 304; fourth enable signal 308; first output clock signal 312; fifth enable signal 316; and second output clock signal 320.

Figure 6:
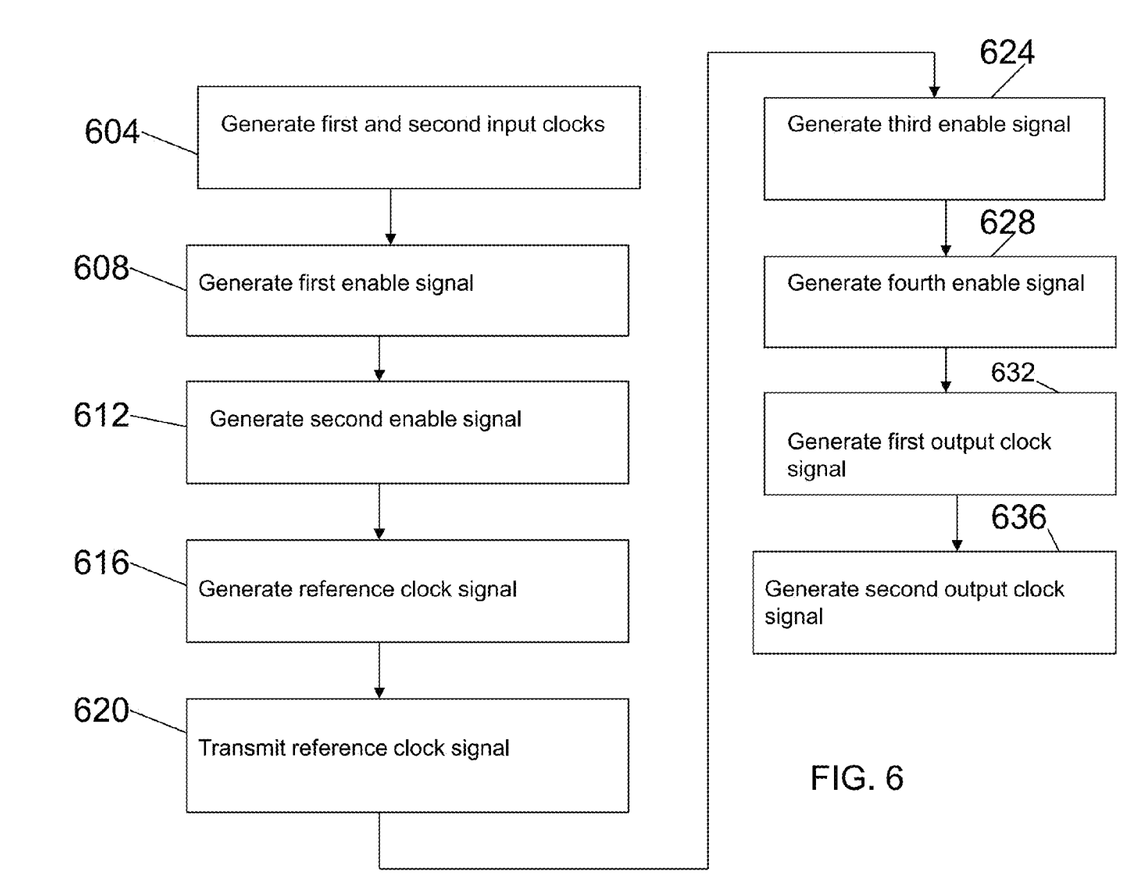
FIG. 6 is a flowchart of a method according to various disclosed embodiments.

FIG. 6 is a flowchart of a process according to various disclosed embodiments. Such a process can be performed, for example, by system 100, as described above, but the process can be performed by any apparatus configured to perform a process as described herein.

In block 604, the first and second input clock signals are generated. In block 608, the first enable signal is generated responsive to a detection of a rising edge of the first input clock signal.

In block 612, the second enable signal is generated responsive to a detection of a rising edge of the second input clock signal. In block 616, the reference clock signal is generated responsive to the first and second enable signals, wherein the reference clock signal is representative of the first and second enable signals.

In block 620, the reference clock signal is transmitted over a single conductor. In block 624, the third enable signal is generated responsive to a detection of a rising edge of the reference clock signal. In block 628, the fourth and fifth enable signals are generated responsive to a detection of a falling edge of the reference clock signal.

In block 632, the first output clock signal is generated by tracking the third enable signal. In block 636, the second output clock signal is generated by tracking and integrating the fifth enable signal.

Those skilled in the art will recognize that, for simplicity and clarity, the full structure and operation of all systems suitable for use with the present disclosure is not being depicted or described herein. Instead, only so much of a system as is unique to the present disclosure or necessary for an understanding of the present disclosure is depicted and described. The remainder of the construction and operation of the disclosed systems may conform to any of the various current implementations and practices known in the art.

Of course, those of skill in the art will recognize that, unless specifically indicated or required by the sequence of operations, certain steps in the processes described above may be omitted, performed concurrently or sequentially, or performed in a different order. Further, no component, element, or process should be considered essential to any specific claimed embodiment, and each of the components, elements, or processes can be combined in still other embodiments.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Those skilled in the art to which this application relates will appreciate that other and further additions, deletions, substitutions and modifications may be made to the described embodiments.

What is claimed is:

1. An apparatus, comprising:
   first and second clocks operable to generate first and second input clock signals, respectively, wherein the first and second input clock signals are asynchronous in relation to one another;
   a first edge detector configured to receive the first input clock signal, the first edge detector operable to detect a rising edge of the first input clock signal and to generate a first enable signal;
   a second edge detector configured to receive the second input clock signal, the second edge detector operable to detect the rising edge of the second input clock signal and to generate a second enable signal;
   a first divider configured to receive the first enable signal and operable to generate a first adjusted enable signal based on a first predetermined factor; and
   a dual clock generator configured to receive the first adjusted enable signal and the second enable signal, and in response operable to generate a reference clock signal and transmit the reference clock signal over a single conductor.

2. The apparatus of claim 1, wherein the second clock signal is a free-run clock or a second network clock.

3. The apparatus of claim 1, wherein the apparatus is a central processor unit (CPU) module.

4. The apparatus of claim 1, wherein the frequency of the first adjusted enable signal is approximately equal to the frequency of the second enable signal.

5. The apparatus of claim 1, wherein the first divider is configured to insert a guard time between the first and second enable signals to prevent overlap of the first and second enable signals.

6. An apparatus comprising:
   a first edge detector configured to receive a reference clock signal via a single conductor, the first edge detector operable to detect a rising edge of the reference clock signal and to generate a first enable signal;
   a second edge detector configured to receive the reference clock signal via the single conductor, the second edge detector operable to detect a falling edge of the reference clock signal and to generate a second enable signal;
   a first controlled oscillator configured to receive the first enable signal and operable to track the first enable signal to generate a first output clock signal;
   an integer controlled oscillator configured to receive the second enable signal and operable to generate a third enable signal that compensates the rate of the second enable signal; and
   a second controlled oscillator configured to receive the third enable signal and operable to track the third enable signal to generate a second output clock signal.

7. The apparatus of claim 6, wherein the apparatus is a peripheral module.

8. The apparatus of claim 7, wherein the peripheral module is connected to a CPU module via the single conductor.

9. The apparatus of claim 8, wherein the reference clock signal is transmitted by a CPU module over the single conductor.

10. A method for transferring two asynchronous clock signals over a single conductor, comprising:
    generating, at a first module, first and second input clock signals;
    detecting, at the first module, a rising edge of the first input clock signal, and in response generating a first enable signal;
    detecting, at the first module, a rising edge of the second input clock signal, and in response generating a second enable signal;
    inserting a guard time between the first and the second enable signals to prevent overlap of the first and the second enable signals;
    generating, at the first module, a reference clock signal responsive to the first and second enable signals, wherein the reference clock signal is representative of the first and second input clock signals;
    receiving, by a second module over the single conductor, the reference clock signal;
    detecting, at the second module, rising and falling edges of the reference clock signal, and in response generating third and fourth enable signals, respectively;
    generating, at the second module, a first output clock signal by sampling the third enable signal;
    generating, at the second module, a fifth enable signal that compensates the rate of the fourth enable signal;
    generating, at the second module, a second sampled output clock signal by sampling the fifth enable signal.

11. The method of claim 10, wherein the first and second output clock signals are synchronized with the first and the second input clock signals, respectively.

12. The method of claim 10, wherein the first input clock signal is synchronized with a network clock.

13. The method of claim 10, wherein the second input clock signal is a free-run clock or a second network clock.

14. The method of claim 10, wherein the first module is a central processor unit (CPU) module.

15. The method of claim 10, wherein the second module is a peripheral module.

16. The method of claim 10, wherein the first and second input clock signals are asynchronous in relation to one another.

17. The method of claim 10, wherein the guard time is inserted by a counter.

18. The method of claim 10, wherein the guard time is inserted by a divider.

* * * * *